United States Patent
Itano et al.

(10) Patent No.: US 7,550,793 B2
(45) Date of Patent: Jun. 23, 2009

(54) IMAGE PICKUP DEVICE AND CAMERA WITH EXPANDED DYNAMIC RANGE

(75) Inventors: Tetsuya Itano, Kanagawa-ken (JP);
 Toru Koizumi, Kanagawa-ken (JP);
 Shin Kikuchi, Kanagawa-ken (JP);
 Akira Okita, Kanagawa-ken (JP);
 Masanori Ogura, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 11/376,213

(22) Filed: Mar. 16, 2006

(65) Prior Publication Data

US 2006/0208292 A1    Sep. 21, 2006

(30) Foreign Application Priority Data

Mar. 18, 2005    (JP)    ............................. 2005-080343

(51) Int. Cl.
*H01L 27/144* (2006.01)
(52) U.S. Cl. ................ 257/239; 257/292; 257/E27.133
(58) Field of Classification Search ................ 257/239, 257/E27.132, E27.133, E31.037, 223, 291, 257/292
See application file for complete search history.

(56) References Cited

U.S. PATENT DOCUMENTS

| | | | |
|---|---|---|---|
| 5,121,225 A | 6/1992 | Murata et al. ................ 358/471 |
| 5,245,203 A | 9/1993 | Morishita et al. ........... 257/113 |
| 5,261,013 A | 11/1993 | Murata et al. ................ 382/65 |
| 5,352,920 A | 10/1994 | Morishita et al. ........... 257/435 |
| 5,475,211 A | 12/1995 | Ogura et al. ............. 250/208.1 |
| 5,698,892 A | 12/1997 | Koizumi et al. ............. 257/620 |
| 6,188,094 B1 | 2/2001 | Kochi et al. ................ 257/232 |
| 6,307,195 B1 | 10/2001 | Guidash ................. 250/208.1 |
| 6,605,850 B1 | 8/2003 | Kochi et al. ................. 257/431 |
| 6,670,990 B1 | 12/2003 | Kochi et al. ................. 348/310 |
| 6,946,637 B2 | 9/2005 | Kochi et al. .............. 250/208.1 |
| 6,960,751 B2 | 11/2005 | Hiyama et al. ........... 250/208.1 |
| 6,974,975 B2 | 12/2005 | Shizukuishi ................. 257/98 |
| 7,016,089 B2 | 3/2006 | Yoneda et al. .............. 358/482 |

(Continued)

FOREIGN PATENT DOCUMENTS

JP    2001-186414    7/2001

(Continued)

*Primary Examiner*—Minh-Loan T Tran
*Assistant Examiner*—W. Wendy Kuo
(74) *Attorney, Agent, or Firm*—Fitzpatrick, Cella, Harper & Scinto (57) ABSTRACT

The image pickup device of the invention has a path deeper in a semiconductor substrate, than a region wherein a channel is formed, upon turning on a first MOS transistor, under a gate thereof. The path is arranged by forming a P-type layer for forming a potential barrier, within a P-type well excluding a region below the gate of the first MOS transistor. Thus, even when the first transfer MOS transistor is securely turned off at accumulation, carriers overflowing from a photodiode can flow into the path, thereby enabling to accumulate the carriers, overflowing from the photodiode, in a carrier accumulation region. Such structure allows to suppress a dark current generation from an interface of a gate oxide film of the first transfer MOS transistor, and also to expand the dynamic range of the image pickup device by the carriers overflowing from the photodiode and flowing through the path into the carrier accumulation region.

6 Claims, 6 Drawing Sheets

U.S. PATENT DOCUMENTS

| | | | |
|---|---|---|---|
| 7,110,030 B1 | 9/2006 | Kochi et al. | 348/308 |
| 7,126,102 B2 | 10/2006 | Inoue et al. | 250/214 |
| 2003/0076431 A1* | 4/2003 | Krymski | 348/308 |
| 2003/0164887 A1 | 9/2003 | Koizumi et al. | 348/308 |
| 2004/0000681 A1* | 1/2004 | Shinohara et al. | 257/290 |
| 2004/0017496 A1* | 1/2004 | Koizumi et al. | 348/308 |
| 2004/0119864 A1* | 6/2004 | Kikuchi | 348/308 |
| 2004/0188597 A1* | 9/2004 | Inoue et al. | 250/214 R |
| 2005/0040446 A1* | 2/2005 | Shinohara | 257/292 |
| 2005/0098805 A1 | 5/2005 | Okita et al. | 257/292 |
| 2005/0122418 A1 | 6/2005 | Okita et al. | 348/340 |
| 2005/0139845 A1 | 6/2005 | Shizukuishi | 257/98 |
| 2005/0168618 A1 | 8/2005 | Okita et al. | 348/335 |
| 2005/0174552 A1 | 8/2005 | Takada et al. | 355/53 |
| 2005/0179796 A1 | 8/2005 | Okita et al. | 348/308 |
| 2005/0185074 A1 | 8/2005 | Yoneda et al. | 348/294 |
| 2005/0268960 A1 | 12/2005 | Hiyama et al. | 136/244 |
| 2005/0269604 A1 | 12/2005 | Koizumi et al. | 257/291 |
| 2006/0027843 A1 | 2/2006 | Ogura et al. | 257/291 |
| 2006/0043261 A1 | 3/2006 | Matsuda et al. | 250/208.1 |
| 2006/0043393 A1 | 3/2006 | Okita et al. | 257/93 |
| 2006/0043439 A1 | 3/2006 | Koizumi | 257/291 |
| 2006/0043440 A1 | 3/2006 | Hiyama et al. | 257/291 |
| 2006/0044434 A1 | 3/2006 | Okita et al. | 348/294 |
| 2006/0044439 A1 | 3/2006 | Hiyama et al. | 348/308 |
| 2006/0157759 A1 | 7/2006 | Okita et al. | 257/292 |
| 2006/0158539 A1 | 7/2006 | Koizumi et al. | 348/300 |
| 2006/0158543 A1 | 7/2006 | Ueno et al. | 348/308 |
| 2006/0208161 A1 | 9/2006 | Okita et al. | 250/208.1 |
| 2006/0208291 A1 | 9/2006 | Koizumi et al. | 257/292 |
| 2006/0221667 A1* | 10/2006 | Ogura et al. | 365/149 |
| 2007/0018080 A1 | 1/2007 | Inoue et al. | 250/214 |

FOREIGN PATENT DOCUMENTS

| | | |
|---|---|---|
| JP | 2004-335802 | 11/2004 |

* cited by examiner

IMAGE PICKUP DEVICE AND CAMERA WITH EXPANDED DYNAMIC RANGE

BACKGROUND OF THE INVENTION

1. Field of the Invention

The present invention relates to an image pickup device and an image pickup system, and more particularly those adapted for employing a CMOS area sensor.

2. Related Background Art

Recently, a CMOS area sensor formed by pixels, each including a photodiode and a MOS transistor, has been employed as an image pickup device. The CMOS sensor has advantages, in comparison with a CCD area sensor, of a lower electric power consumption, a lower driving electric power and a possible high-speed operation. The demand for such CMOS area sensor is anticipated to grow hereafter.

The CMOS sensor is constituted of pixels, each formed for example by a photodiode, a floating diffusion region, a transfer transistor for transferring carriers from the photodiode to the floating diffusion region, and a reset transistor for resetting the floating diffusion region to a predetermined potential. A plurality of such pixels are arranged in a matrix to constitute a CMOS area sensor.

In an image pickup device such as a CMOS area sensor, proposals have been made to expand a dynamic range of such a device. For example, Japanese Patent Application Laid-open Nos. 2001-186414 and 2004-335802 propose technologies for expanding the dynamic range of an image pickup device.

However such prior technologies involve a drawback that the image-pickup device often generates noises thereby possibly deteriorating the image quality.

SUMMARY OF THE INVENTION

An image pickup device of the present invention including plural pixels, each including a photoelectric conversion unit arranged in a semiconductor substrate, a transfer MOS transistor for transferring carriers generated in the photoelectric conversion unit to a carrier accumulation region, and a path for moving at least a part of the carriers overflowing from the photoelectric convening portion to the carrier accumulation region, wherein the path is arranged between the photoelectric conversion unit and the carrier accumulation region and deeper in the semiconductor substrate than a channel formed, in a vicinity of a gate insulation film of the MOS transistor, by turning on the MOS transistor, in the vicinity of a gate insulation film of the MOS transistor, and the pixel generates a pixel signal based on both of the carrier transferred by said transfer MOS transistor and the carrier overflowed from the photoelectric conversion unit through the path to the carrier accumulation region.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

In the following, a first embodiment of the present invention will be explained with reference to the accompanying drawings.

Figure 1:
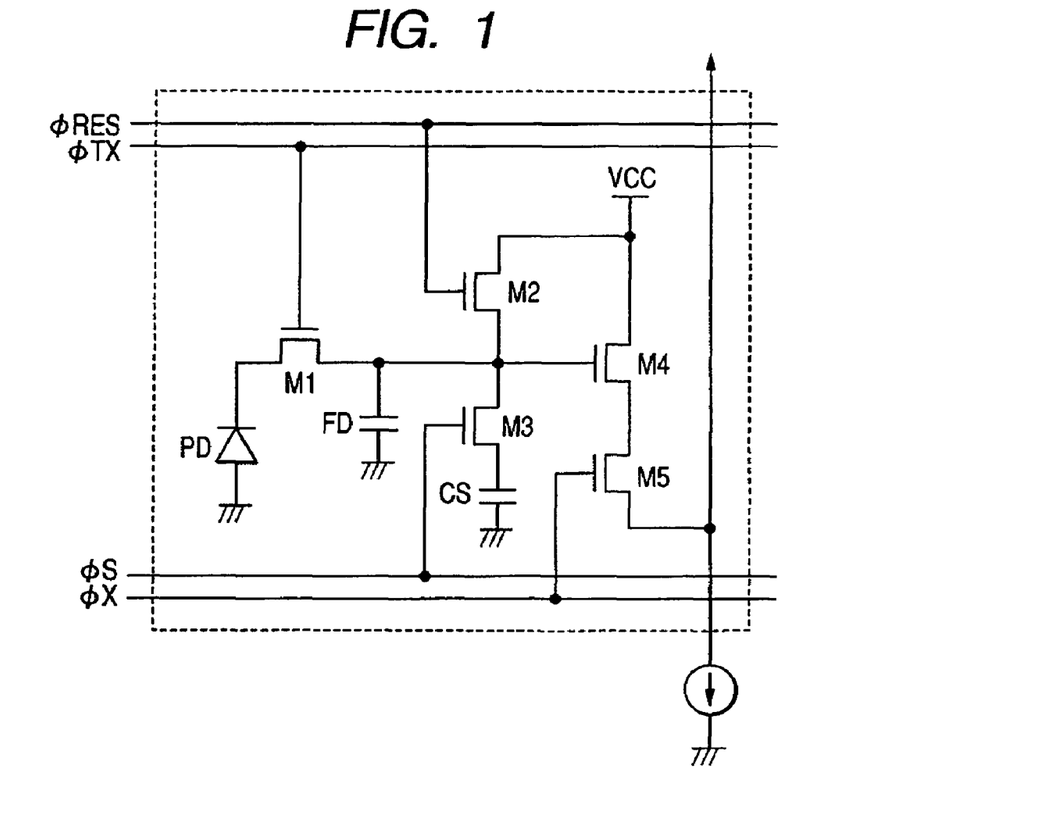
FIG. 1 is a circuit diagram showing a schematic structure of a pixel provided in an image pickup device.
Figure 3:
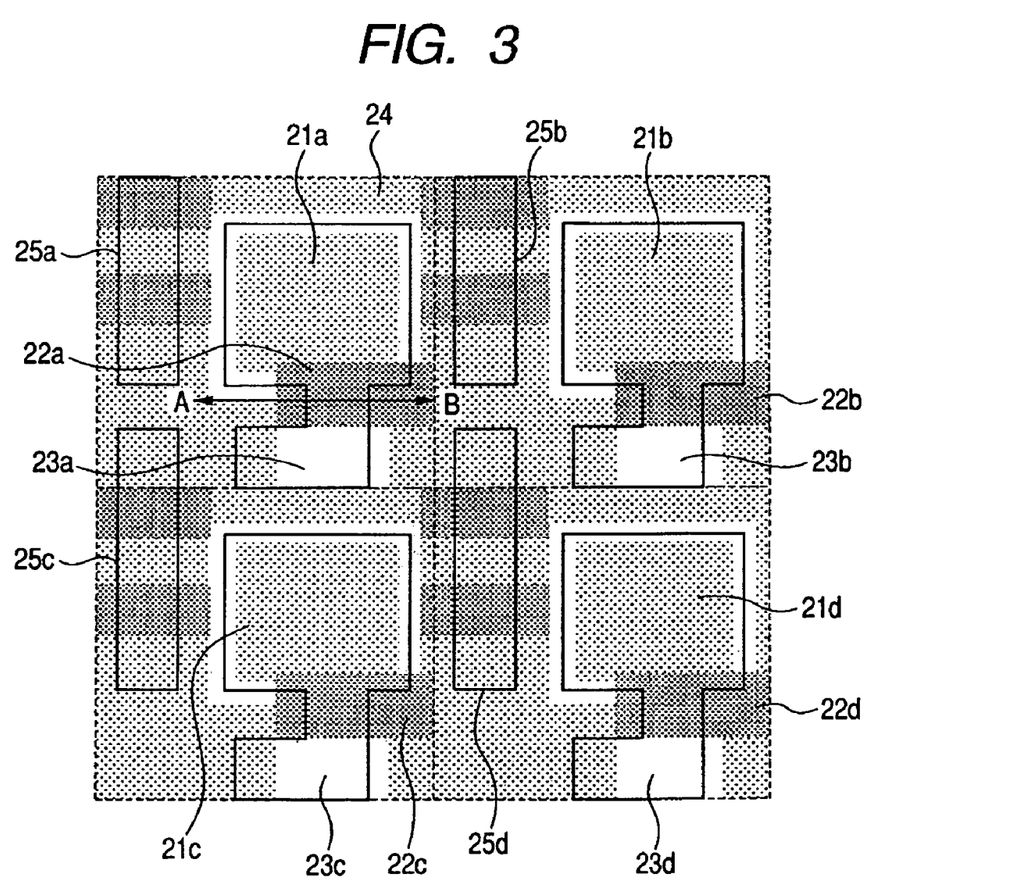
FIG. 3 is a plan view showing a schematic pixel structure in the first embodiment.
Figure 4A:
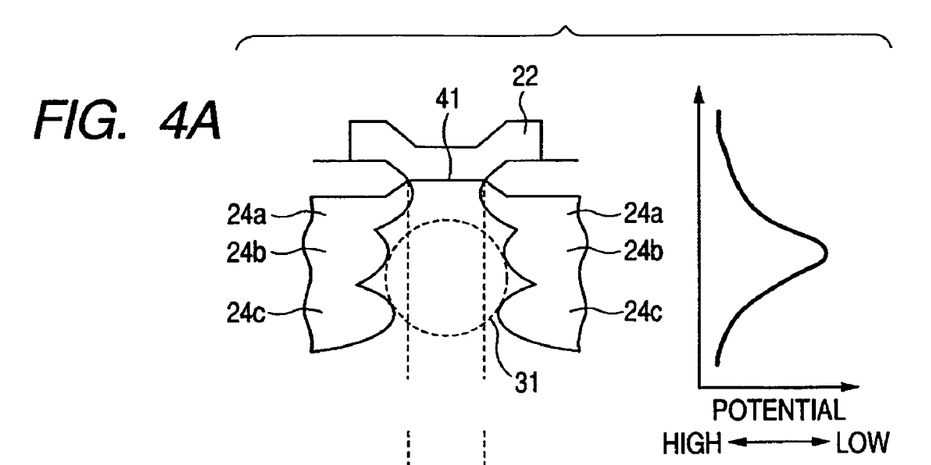
FIGS. 4A, 4B and 4C are simplified views of a pixel in the first embodiment, along a line A-B in FIG. 3.

FIG. 1 illustrates a schematic structure of a pixel provided in the image pickup device of the present embodiment. FIG. 3 is a schematic plan view showing a layout of four pixels shown in FIG. 1, and FIG. 4A is a schematic cross sectional view along a line A-B.

Also in contrast to the present embodiment, there is known a method of controlling (elevating) a gate potential of the transfer transistor for example at about 0 V, which carriers are accumulated in the photodiode constituting the photoelectric converting portion. In this method, the transfer transistor assumes an incompletely turned-off state, whereby a part of the carriers overflowing from the photodiode flows into the floating diffusion region. Such carriers overflowing from the photodiode are used, together with the carriers accumulated in the photodiode, as a pixel signal to achieve an expansion of the dynamic range of the CMOS area sensor.

In such a method, however, the overflowing carriers pass through the channel portion of the MOS transistor and are influenced more by the dark current. In contrast, the construction of the present embodiment reduces the influence of the dark current while expanding the dynamic range.

The image pickup device of the present embodiment, shown in FIG. 1, has plural pixels each having a photodiode PD, a first transfer MOS transistor M1, a resetting MOS transistor M2, a second transfer MOS transistor M3, a source follower MOS transistor M4, and a selecting MOS transistor M5. The pixels are arranged in a two-dimensional matrix of n rows by m columns (n, m being natural numbers).

The photodiode PD is connected, through the first transfer MOS transistor M1 to a floating a diffusion region FD for temporary carrier accumulation. The floating diffusion region FD is connected to either of a source region and a drain region of the reset MOS transistor M2 and the second transfer MOS transistor M3. It is also connected to a gate of the source follower MOS transistor M4. The other of the source region and the drain region of the second transfer MOS transistor M3 is connected to an additional capacitor CS for accumulating the carriers overflowing from the photodiode PD.

The source follower MOS transistor M4 is directly connected to the selecting MOS transistor M5 and amplifies a signal based on the carriers transferred to the floating diffusion region FD.

The first transfer MOS transistor M1, the resetting MOS transistor M2, the second transfer MOS transistor M3 and the selecting MOS transistor M5 are respectively on/off controlled by a control signal supplied to each gate. Each MOS transistor functions in the following manner. The MOS transistor is turned on and becomes conductive when a high-level control signal is supplied to the gate thereof, and is turned off and becomes non-conductive when a low level control signal is supplied to the gate. In the conductive state, a channel constituting a path for carriers is formed in the vicinity of the gate insulation film. In the present embodiment, a path is formed below the gate of the transfer MOS transistor M1, namely between the photoelectric converting portion and the floating diffusion region and in a part of the semiconductor substrate deeper than a region where the channel of the transistor is formed. In the present description, a direction from a principal surface of the semiconductor substrate toward an interior thereof is called a lower or, downward direction, and an opposite direction is called an upper or upward direction.

In the following, the function of each transistor in the present embodiment will be explained. A gate signal fTX is supplied to the gate of the first transfer MOS transistor M1, and a gate signal fS is supplied to the gate of the second transfer MOS transistor M3. Also a gate signal fX is supplied to the gate of the selecting MOS transistor M5, and a gate signal fRES is supplied to the gate of the reset MOS transistor M2.

The control signal fTX controls the transfer of the carriers, accumulated in the photodiode PD, to the floating diffusion region FD. The control signal fS controls the transfer of the carriers, overflowing from the photodiode PD and accumulated in the additional capacitor CS, to the floating diffusion region FD. The control signal fX executes pixel selection. The control signal fRES controls so-called resetting operation, for bringing a potential of the floating diffusion region to a power supply potential Vcc (for example +5 V).

Though not illustrated, the image pickup device is provided, outside a pixel area containing a plurality of pixels as shown in FIG. 1, with a memory circuit including a holding capacity for holding a signal corresponding a sum S+N of a charge signal S based on carriers generated in the photodiode and transferred to the floating diffusion region FD and a reset signal N, and a holding capacity for holding the reset signal N.

Also provided is a differential amplifier for amplifying a differential signal (S) of the signals held in the holding capacities Cs, and the image pickup device outputs a signal obtained from the differential amplifier, as an image signal.

Figure 2:
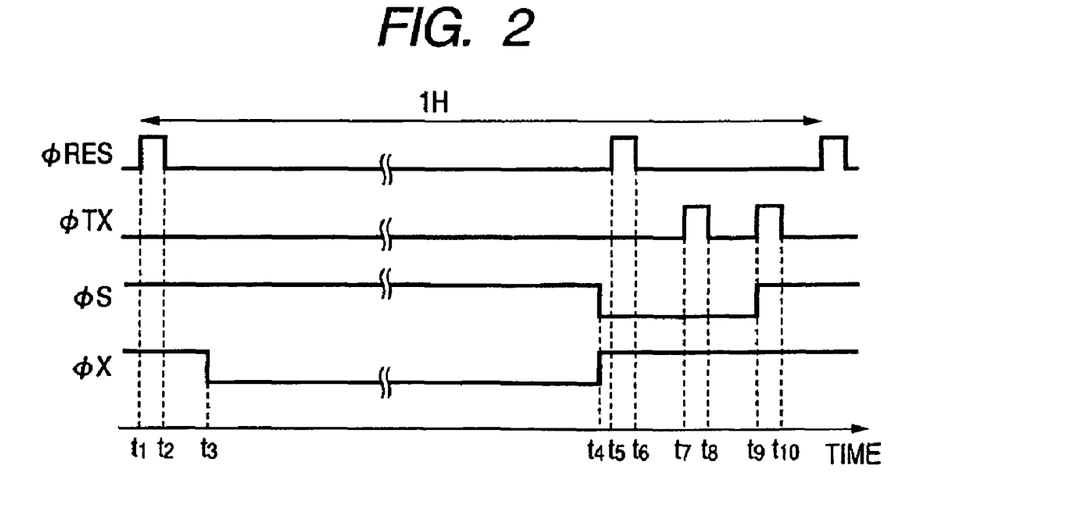
FIG. 2 is a timing chart showing a pixel readout operation of the image pickup device in a first embodiment.

Now reference is made to a timing chart shown in FIG. 2, for explaining an image signal readout operation in the image pickup device of the present, embodiment.

At first, at a timing t1, a high level control signal φS is supplied to the second transfer MOS transistor M3. Also, while a high level control signal φX is supplied to the selecting MOS transistor M5, a high level control signal φRES is supplied to the gate of the reset MOS transistor M2. Thus, the reset MOS transistor M2, the second transfer MOS transistor M3 and the selecting MOS transistor M5 are turned on. By turning on the selecting MOS transistor M5, there is selected a pixel to which the selecting MOS transistor M5 belongs. In this state the floating diffusion region FD and the additional capacitor CS are reset to the power supply voltage Vcc.

At a timing t2, a low-level control signal φRES is supplied to the reset MOS transistor M2 thereby turning off the same. This operation terminates the resetting operation of the floating diffusion region FD and the additional capacitor CS. By such resetting operation, a reset signal (N2) is read out from the floating diffusion region FD and the additional capacitor CS.

At a timing t3, a low-level control signal fX is supplied to the selecting MOS transistor M5 to turn off the same. In the present embodiment, a light introduction is initiated for example by opening a shutter and there is initiated accumulation of carriers generated in the photodiode PD. Then in a period t3-t4, carriers are accumulated in the photodiode PD. At the same time, carriers overflowing from the photodiode PD flows into a path 31 shown in FIG. 4 and into the additional capacitor CS. The carriers flowing into the path 31 accumulated in the floating diffusion region FD. Since the second transfer MOS transistor M3 is turned on during this period, the carriers flowing into the floating diffusion region FD also flows into and is accumulated in the additional capacitor CS.

At a timing t4, a high level control signal φX is supplied to the selecting MOS transistor M5 and a low-level control signal φS is supplied to the second transfer MOS transistor M3, whereby the selecting MOS transistor M5 is turned on, while the second transfer MOS transistor M3 is turned off.

At a timing t5, a control signal φRES is supplied to the reset MOS transistor M2 to turn on the same, thereby resetting the floating diffusion FD to the power supply Vcc.

At a timing t6, a low level control signal φRES is supplied to the reset MOS transistor M2 to turn off the same, thereby terminating the resetting operation of the floating diffusion region FD. By such resetting operation, a reset signal (N1) in the floating diffusion region FD is read out.

At a timing t7, a high level control signal φTX is supplied to the first transfer MOS transistor M1 to turn on the same, thereby transferring the charge, accumulated in the photodiode PD, to the floating diffusion region FD. As will be explained later, the present embodiment employs a signal of 5 V as the high level control signal φTX.

At a timing t8, a low level control signal φTX is supplied to the first transfer MOS transistor M1 to turn off the same, thereby terminating the transfer operation for the charge accumulated in the photodiode PD. By such transfer operation, a reset, signal N1 in the floating diffusion region FD and a charge signal S1 based on the charge accumulated in the floating diffusion region FD are read out in an added state, thus providing a signal corresponding to N1+S1. The present embodiment employs a signal of –1 V as the low level control signal φTX.

At a timing t9, a high level control signal φTX is supplied to the first transfer MOS transistor M1 and a high level control signal φS is supplied to the second transfer MOS transistor M3, thereby turning on the first transfer MOS transistor M1 and the second transfer MOS transistor M3. By this operation, a charge signal S1 based on the charge accumulated in the floating diffusion region FD, a charge signal S2 based on the charge accumulated in the additional capacitor CS, a reset signal in the floating diffusion region FD and a reset level N2' substantially equal to a reset signal in the floating diffusion region FD and in the additional capacitor CS are read in an added state.

Finally, at a timing t10, a low level control signal φTX is supplied to the first transfer MOS transistor M1 to turn off the same, thereby completing operations of one cycle.

In the present embodiment, charge moves in the following manner within a period of t3-t4. At least a part of the charge overflowing from the photodiode PD is made to flow into the floating diffusion region FD through the path 31 shown in FIG. 4. The path 31 of the present embodiment will be explained in the following, with reference to FIGS. 3 and 4.

FIG. 3 is a schematic plan view of the structure of pixels in the present embodiment, illustrating 4 pixels in a 2×2 arrangement, but the pixels of the image pickup device of the present embodiment are naturally not limited to four pixels.

In FIG. 3, 21a-21d indicate photodiodes corresponding to the photodiode PD shown in FIG. 1. Also 22a-22d indicate first transfer MOS transistors corresponding to the first transfer MOS transistor M1 in FIG. 1, and 23a-23d indicate floating diffusion regions corresponding to the floating diffusion region FD in FIG. 1.

24 indicates a P-semiconductor region for forming a potential barrier, hereinafter simply called a potential barrier 24. 25a-25d indicate device groups other than the photodiodes 21a-21d and the first transfer MOS transistors 22a-22d. More specifically, the device groups 25a-25d include reset MOS transistors M2, second transfer MOS transistors M3, source-follower MOS transistors M4, selecting MOS transistors M5 and additional capacities CS, as shown in FIG. 1. Also a thick-lined area in FIG. 3 indicates an impurity diffusion region in each element such as an N-semiconductor region.

A potential barrier is one of barriers. And, the potential barrier may be controlled by controlling an impurity concentration in a region in which the potential barrier is formed, or by controlling a voltage of an electrode formed in the region in which the potential barrier is formed.

In the present embodiment, the photodiodes 21a-21d, the first transfer MOS transistors 22a-22d and the device groups 25a-25d are formed on a P-semiconductor well (P-well).

The potential barrier 24 is a region containing a P-type impurity at a concentration higher than in the P-well. Such potential barrier 24 of a high-concentration P-semiconductor is formed within the P-well area, excluding below the gates of the first transfer MOS transistors 22a-22d. However, the potential barrier 24 need, not be formed over the entire of the P-well, and it may be arranged, for example, in a region deeper than the region required for forming the path 31. But, it is not necessary to arrange the potential barrier always in deeper region.

Figure 4B:
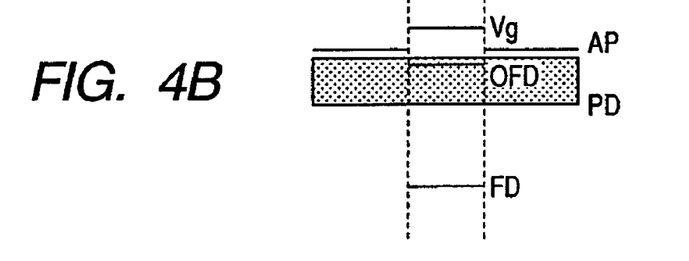
Figure 4C:
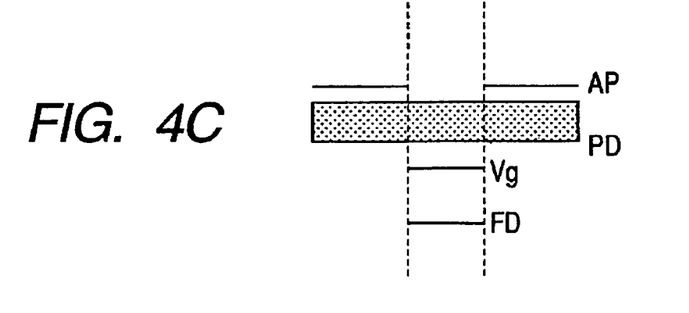

FIG. 4A is a schematic cross sectional view along a line A-B, together with a potential distribution of the potential barrier 24 along the depth of the semiconductor substrate. In the present embodiment, plural regions 24a-24c are formed, but an integral region may also be formed FIGS. 4B and 4C illustrate the potential relationship of the devices respectively at a charge accumulation and at a charge transfer.

The present embodiment has, as shown in FIG. 4A, a potential barrier 24 of a laminated structure of a P-semiconductor region 24a of a first concentration constituting a channel stop, a P-semiconductor region 24b of a second concentration constituting a second potential barrier, and a P-semiconductor region 24c of a third concentration constituting a third potential barrier. As in the present embodiment, the region 24a may be employed as a first potential barrier. However, in an alternative embodiment, the region 24a may perform the above functions of regions 24a-24c. In the present embodiment, the region 24a is regarded as a first potential barrier constituting P-semiconductor region.

Also in the present embodiment, the second potential barrier constituting P-semiconductor region 24b has a concentration of a P-type impurity, lower than that in the P-semiconductor region 24a constituting the first potential barrier and in the P-semiconductor region 24c constituting the third potential barrier, provided above and below. In this manner, within a region below the gate of the first MOS transistor 22a-22d, a lowest potential is realized in a region of a depth comparable to that of the P-semiconductor region 24b constituting the second potential barrier. Therefore, in the present embodiment, the path 31 can be regulated in a potential by varying the impurity concentration in the direction of depth, in the P-semiconductor layer 24b constituting the second potential barrier.

More specifically, the path 31 is to be formed in a position deeper than a channel (namely below a channel), formed between the source and the drain of the first transfer MOS transistor 22a-22d. The path 31 is preferably formed as deep as possible, so as not to be influenced by the gate potential of the first transfer MOS transistor 22a-22d. However, the path 31, being used to receive the charge overflowing from the photodiode 21 as explained above, has to be formed shallower than a lower end of the photodiode 21.

FIG. 4B shows a potential relationship in case of a charge accumulation in the photodiode 21 or in the floating diffusion region 23, among a gate potential Vg of the first transfer MOS transistor 22, a potential OFD in the path 31, a potential PD of the photodiode 21, a potential FD of the floating diffusion region 23, and a potential AP in the potential barrier-constituting P-semiconductor layer 24 on both sides (in direction A-B in FIG. 3) of the path 31.

By forming the P-semiconductor region 24 as shown in FIG. 4A, the potential OFD of the path 31 provided below the gate of the first transfer MOS transistor 22 can be made lower than the potential PD of the photodiode, whereby the charge overflowing from the photodiode at the charge accumulation can flow into the path 31.

In the present embodiment, as explained above, the P-semiconductor region 24 is formed as a potential barrier in the P-type well region except for a region below the gate of the first transfer MOS transistor 22. At the charge accumulation, the gate potential of the first transfer MOS transistor 22 is set at −1 V, thereby elevating the potential in the region immediately under the gate of the first transfer MOS transistor 22, thereby turning off the same as securely as possible. However the P-type conductor region 24 allows the carriers, overflowing from the photodiode 21, to flow into the path 31. It is thus rendered possible to prevent a region, immediately under the gate of the first transfer MOS transistor 22, from becoming depleted, thereby preventing, as far as possible, a dark current generation from the interface of the gate oxide film 41 of the first transfer MOS transistor 22. Also it is rendered possible, by the charge accumulated in the floating diffusion region FD through the path 31, to expand the dynamic range of the image pickup device.

The charge transfer from the photodiode 21 takes place in the following manner. FIG. 4B illustrates a potential relationship of the gate potential Vg of the first transfer MOS transistor 22, the potential OFD in the path 31, the potential PD of the photodiode 21, and the potential FD in the floating diffusion region 23. Also the potential AP of the P-semiconductor region 24 constituting the potential barrier in the horizontal direction of the path 31 is given as shown in FIG. 4C. A graph in FIG. 4A corresponds to the P-semiconductor region 24 in the cross-sectional view of the image pickup device, and indicates that the potential becomes lower in the region 24b. In this manner the path 31 is regulated at a lower potential.

For a charge transfer, the gate potential Vg of the first transfer MOS transistor 22 is shifted to 5 V, thereby lowering the potential in the region (namely a channel) immediately under the gate of the first transfer MOS transistor 22 as shown in FIG. 4C. Therefore, the charge accumulated in the photodiode 21 can be securely transferred to the floating diffusion region 23.

In the present embodiment, the gate potential Vg of the first transfer MOS transistor 22 is set at −1 V at the charge accumulation and at 5 V at the charge transfer, but the gate potential Vg of the first transfer MOS transistor 22 is naturally not limited to such values.

Also the second transfer MOS transistor M3 and the additional capacitor CS as in the present embodiment can advantageously expand further the dynamic range of the image pickup device, but such second transfer MOS transistor M3 and additional capacitor CS are not essential. Also in the configuration of the present embodiment, a different driving method may be employed. For example, it is also possible to turn off the second transfer MOS transistor at the charge accumulation from t3 to t4, and to separately read the floating diffusion region FD and the additional capacitor CS at the signal readout. Also in case of not employing the second transfer MOS transistor M3 and the additional capacitor CS, there can be adopted a driving method of reading only the charge accumulated in the floating diffusion region FD or a driving method of reading the charge of the floating diffusion region FD and that of the photodiode, combined in the floating diffusion region FD. It is furthermore possible to add and read the data in the aforementioned holding capacities, provided outside the pixel area for holding the S and N signals.

In the present embodiment, the P-semiconductor layer 24 is provided for forming the potential barrier, but it is only required that the path 31 has a P-type impurity concentration lower than that in lateral regions (along direction A-B in FIG. 3) of the path 31. Stated differently, the potential barrier constituting P-type layer 24 may be dispensed with as long as the potential in the path 31 is made lower than in the lateral regions (along direction A-B in FIG. 3) of the path 31. For example an N type impurity may be added in the position of the path 31 in FIG. 4A.

Figure 5:
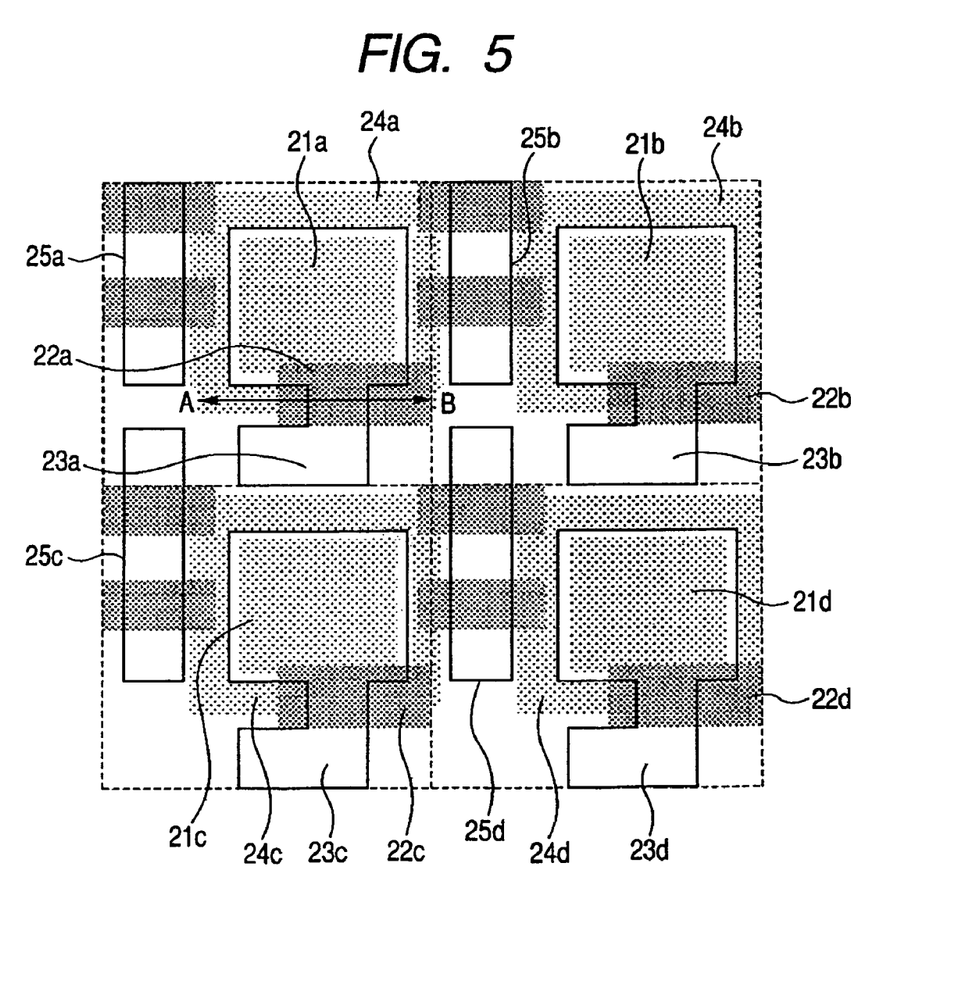
FIG. 5 is a plan view showing a schematic pixel structure in the first embodiment.

Also the P-type layer 24 constituting the potential barrier may be formed, as shown in FIG. 3, including a region under the transistor 25 but excluding, the transfer MOS transistor 22, or as shown in FIG. 5, so as to cover at least a region where the photodiode PD is formed.

The present embodiment is not limited to the circuit structure shown in FIG. 1, but may separately include an additional capacitor between the floating diffusion region FD and the first transfer MOS transistor M1 or between the second transfer MOS transistor M3. Also a MOS transistor as a switch may be provided between such separate additional capacitor and the floating diffusion region FD. In such case, the above described path is provided under a channel of the MOS transistor provided between the separate additional capacitor and the photodiode. Also the amplifying element may be disposed within the pixel. But, it is indispensable to dispose the amplifying element within the pixel. And, the carrier is transferred by the first transfer MOS transistor M1 to an accumulating capacitor on the signal line.

Also the photoelectric converting portion is not limited to a photodiode but may be an element of a similar function, such as a photogate.

(Application to Digital Still Camera)

As an application of the image pickup device of the above described embodiment to a image pickup system, an embodiment of application to a digital still camera will be explained with reference to a block diagram shown in FIG. 6.

Figure 6:
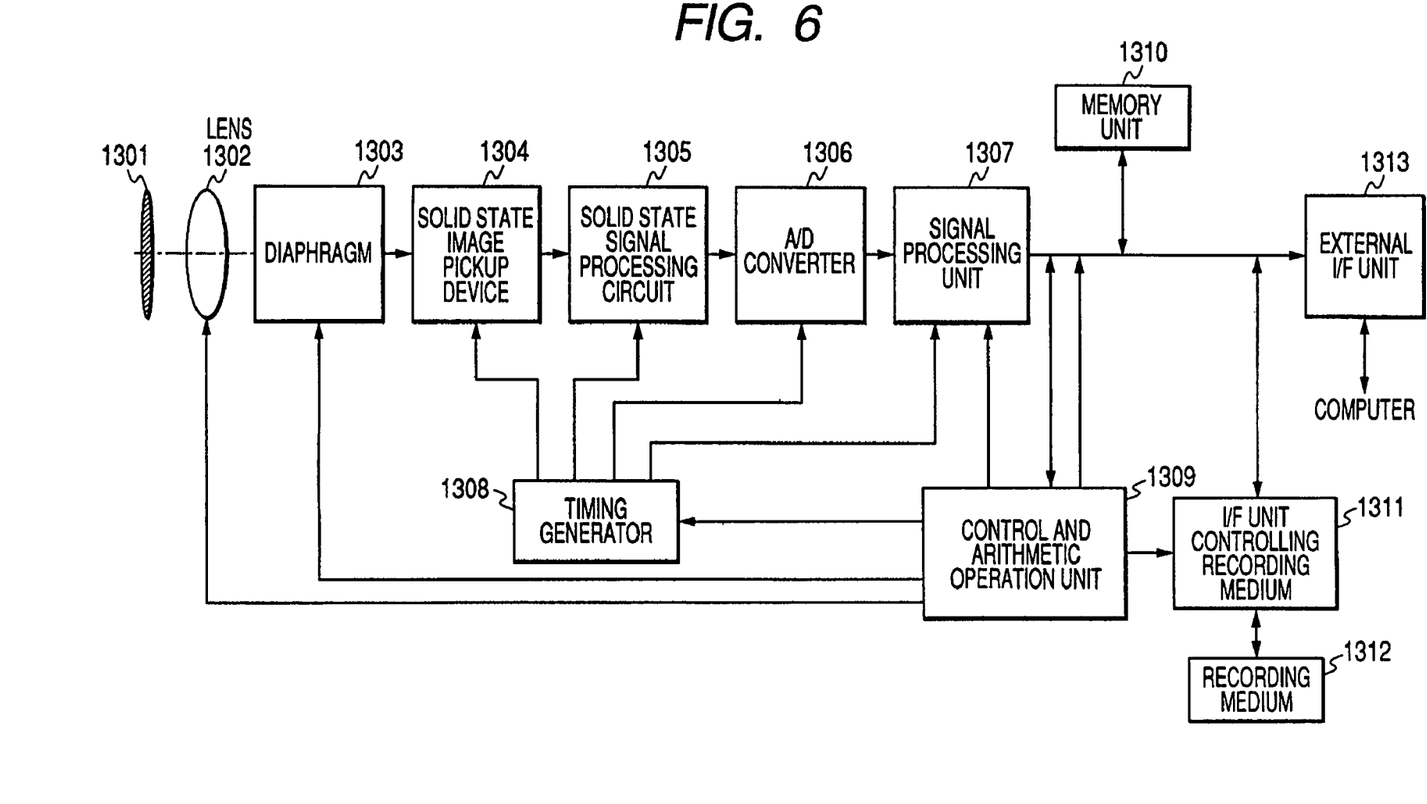
FIG. 6 is a block diagram showing a construction of a digital still camera.

In FIG. 6, there are shown a barrier 1301 serving for lens protection and as a main switch a lens 1302 for focusing an optical image of an object on an image pickup device 1304; an iris 1303 for varying a light amount transmitted by the lens 1302; an image pickup device 1304; for fetching an object focused by the lens 1302 as an image signal and an A/D converter 1306 for executing an analog to digital conversion on the image signal outputted from the image pickup device 1304.

There are further provided a signal processing portion 1307 for executing various corrections and a data compression on the image data outputted from the A/D converter 1306; a timing generator 1308 for outputting various timing signals to the image pickup device 1304, the image signal processing circuit 1305, the A/D converter 1306 and the signal processing portion 1307; a control/arithmetic operation portion 1309 for executing various operations and controlling the entire digital still camera a memory 1310 for temporarily storing image data; an interface 1311 for recording into or readout from a recording medium; a detachable recording medium 1312 such as a semiconductor memory for recording or reading of the image data; and an interface 1313 for communication for example with an external computer.

The image pickup device 1304 and the timing generator 1308 may be formed on a same semiconductor substrate, namely in a same chip. A single-chip structure allows to realize a smaller digital still camera.

In the following there will be explained a function of the digital still camera of the above-described configuration in an image pickup operation.

When the barrier 1301 is opened, the main power supply is turned on. Then power supply is turned on for a control system and then for an image pickup system such as the A/D converter 1306.

Then, in order to control an exposure amount, the control/arithmetic operation portion 1309 fully opens the iris 1303, and a signal outputted from the image pickup device 1304 is converted by the A/D converter 1306 and is supplied to the signal processing portion 1307.

Based on such data, the control/arithmetic operation portion 1309 calculates an exposure amount.

A brightness is judged according to the result of such light metering, and the control/arithmetic operation portion 1309 controls the iris according to the result.

Then a high-frequency component is extracted from the signal outputted from the image pickup device 1304, and the control/arithmetic operation portion 1309 calculates a distance to the object. It then drives the lens to judge whether it is in an in-focus state, and, if not in focus, it repeats the calculation by driving the lens again. After an in-focus state is confirmed, a main exposure is initiated.

When the exposure is terminated, an image signal outputted from the image pickup device 1304 is subjected to an A/D conversion in the A/D converter 1306, then transmitted by the signal processing portion 1307 and is written into the memory 1310 by the control/arithmetic operation portion 1309.

Then the data accumulated in the memory 1310 are transmitted, by the control/arithmetic operation portion 1309, through the recording medium I/F and recorded in the detachable recording medium 1312 such as a semiconductor memory. Otherwise, the data may be directly supplied through the external I/F 1313 to a computer or the like for image processing.

In case of employing the image pickup device of the first embodiment, the data read from the photodiode and the data read separately from the additional capacitor are processed in the signal processing portion 1307 to obtain a single image signal. It is also possible to record these data in the memory 1310 and to execute a processing in an external processing portion such as a computer, or to unite these data in the image pickup device.

As explained in the foregoing, the digital still camera of the present embodiment allows to obtain a still image with a wide dynamic range.

(Application to Digital Video Camera)

As an application of the image pickup device of the above-described embodiment to a image pickup system, an embodiment of application to a digital video camera will be explained with reference to a block diagram shown in FIG. 7. Functions or components same as those in the digital, still camera will not be explained further in duplication.

Figure 7:
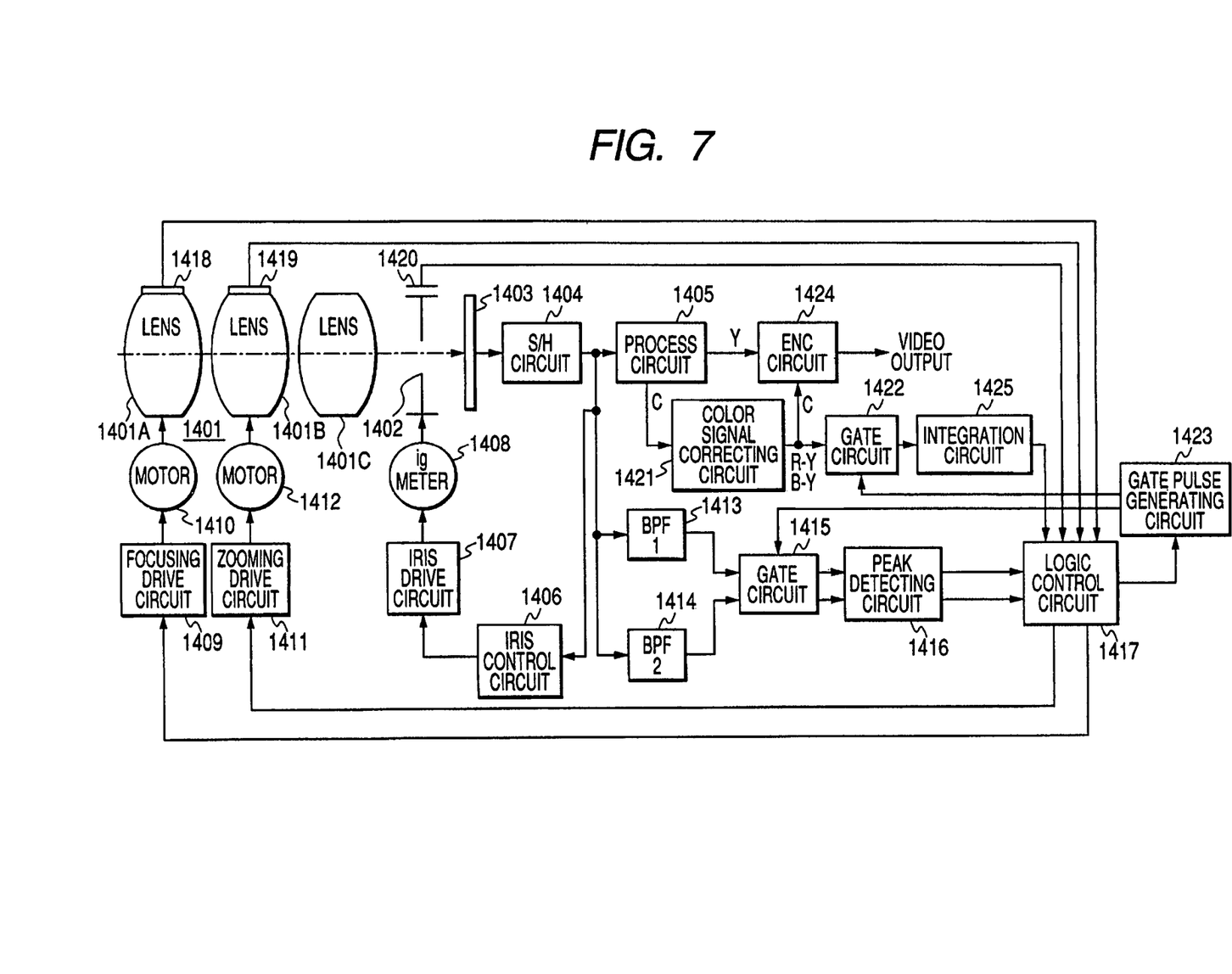
FIG. 7 is a block diagram showing a construction of a digital still camera.

In FIG. 7, an imaging lens 1401 includes a focusing lens 1401A for focusing, a zoom lens 1401B for zooming, and an focusing lens 1401C.

There are also provided an iris and a shutter 1402; an image pickup device 1403 for photoelectric conversion of an object image, focused on an image pickup plane, into an electrical captured image signal; and a sample-hold circuit (S/H circuit) 1404 for sample-holding of the captured image signal from the image pickup device 1403 and executing an amplification, thereby outputting an image signal.

A process circuit 1405 executes processes such as a gamma correction, a color separation and a blanking on the image signal from the sample-hold circuit 1404 and outputs a luminance signal Y and chrominance signals C. The chrominance signals C outputted from the process circuit 1405 are corrected, in a color signal correction circuit 1421, in a white balance and a color balance, are outputted as color difference signals R-Y and B-Y.

The luminance signal Y from the process circuit 1405 and the color difference signals, R-Y, B-Y from the color signal correction circuit 1421 are modulated in an encoder circuit (ENC) 1424 to provide a standard television signal, which is supplied to an unillustrated video recorder or an electronic view finder for monitoring.

An iris control circuit 1406 controls an iris drive circuit 1407 based on the image signal supplied from the sample-hold circuit 1404 for automatic control or an ig meter to control an aperture of the iris 1402 in such a manner that the image signal assumes a predetermined constant level.

Band-pass filters (BPF) 1413, 1414 having different bands extract, from the image signal outputted by the sample-hold circuit 1404, a high-frequency component required for focus detection. Signals from the first band-pass filter (BPF1) 1413 and the second band-pass filter (BPF2) 1414 are respectively gated by a gate circuit 1415 and a focus gate frame signal, then subjected to the detection of a peak value which is held in a peak detection circuit 1416 and supplied to a logic control circuit 1417.

This signal is called a focus voltage, which is used for focusing.

There are also provided a focus encoder 1418 for detecting a position of the focusing lens 1401A, a zoom encoder 1419 for detecting a focal length of the zoom lens 1401B, and an iris, encoder 1420 for detecting an aperture of the iris 1402. The detection values of these encoders are supplied to the logic control circuit 1417 for system control.

The logic control circuit 1417 executes a focusing operation based on a focus detection on the object according to an image signal corresponding to a predetermined focus detection area.

More specifically, at first peak value information of the high-frequency components supplied from the band-pass filters 1413, 1414 is fetched, and control signals for instructing a rotating direction, a rotating speed, and a rotation/stop operation of a focusing motor 1410 is supplied to the focusing drive circuit 1409 in order to drive the focusing lens 1401A to a position where the peak value of the high-frequency component becomes maximum.

As explained in the foregoing, the image pickup apparatus of each embodiment has a path in which at least a part of the carriers overflowing from the photoelectric converting portion passes and moves to the floating diffusion region. Such path is provided, in the semiconductor substrate, between the photoelectric converting portion and the floating diffusion region, and deeper than the channel to be formed in the vicinity of the gate insulation film of the transfer MOS transistor by turning on the transfer MOS transistor.

Such path allows, when the transfer MOS transistor is securely turned off at the carrier accumulation, to accumulate the carriers, overflowing from the photoelectric converting portion, in the floating diffusion region. Such carriers is utilized to expand the dynamic range of the image pickup device. Also a noise generation from the transistor can be suppressed, as the transfer MOS transistor is securely turned off.

The embodiments explained in the foregoing are mere examples for executing the present invention, and are not to be construed to restrict the technical scope of the present invention. The present invention is thus subject to various modifications and executable in various forms, without departing from the technical concept or the principal features thereof.

This application claims priority from Japanese Patent Application No. 2005-080343 filed Mar. 18, 2005, which is hereby incorporated by reference herein.

What is claimed is:

1. An image pickup device comprising:
   plural pixels, each pixel including:
      a photoelectric conversion unit arranged in a semiconductor substrate;
      a first transfer MOS transistor for transferring carriers generated in the photoelectric conversion unit through a channel in a vicinity of a gate insulation film of the first transfer MOS transistor to a carrier accumulation region, the channel being formed when the first transfer MOS transistor is turned on;
      a first conductivity type semiconductor region arranged under a gate electrode of the first transfer MOS transistor; and
      a second transfer MOS transistor for transferring at least a part of carriers overflowing from the photoelectric conversion unit through a path to a storage capacitor at a time when the first transfer MOS transistor is turned off, the second transfer MOS transistor being arranged between the carrier accumulation region and the storage capacitor,
      wherein the path is arranged between the photoelectric conversion unit and the carrier accumulation region and deeper in the semiconductor substrate than a depth of the channel formed when the first transfer MOS transistor is turned on,
      wherein the path is surrounded by the first conductivity type semiconductor region and a well of the first conductivity type along a sectional plane in a direction of a channel width of the first transfer MOS transistor,
      wherein the path is shorter than a width of the gate electrode of the first transfer MOS transistor in the direction of the channel width of the first transfer MOS transistor, and
      wherein the pixel generates a pixel signal based on both the carriers transferred by the first transfer MOS transistor and the carriers that overflow from the photoelectric conversion unit through the path.

2. An image pickup device according to claim 1, wherein the carrier accumulation region is formed by a floating diffusion region.

3. An image pickup device according to claim 1, wherein: the photoelectric conversion unit is formed by a first semiconductor region of a second conductivity type for accumulating the carriers and a second semiconductor region of the first conductivity type; and the path is formed in a shallower position than a lower end of the first semiconductor region.

4. An image pickup device according to claim 3, wherein the path is formed by a semiconductor region of the second conductivity type.

5. An image pickup device according to claim 1, wherein the image pickup device is incorporated in an image pickup system that includes:
   a lens for focusing an optical image on the image pickup device; and
   a diaphragm for varying an amount of light transmitted by the lens.

6. An image pickup device according to claim 1,
   wherein, at a turning on of the transfer MOS transistor, a region in which the channel is formed by turning on the transfer MOS transistor is at a potential lower than a potential of the path, and
   wherein, at a turning off of the transfer MOS transistor, the region is at a potential higher than a potential of the path.

* * * * *